(12) United States Patent
Asamura et al.

(10) Patent No.: US 7,649,427 B2
(45) Date of Patent: Jan. 19, 2010

(54) CRYSTAL OSCILLATOR

(75) Inventors: Fumio Asamura, Saitama (JP); Takeo Oita, Saitama (JP); Katsuaki Sakamoto, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 78 days.

(21) Appl. No.: 11/978,728

(22) Filed: Oct. 30, 2007

(65) Prior Publication Data

US 2008/0106347 A1    May 8, 2008

(30) Foreign Application Priority Data

Oct. 30, 2006    (JP)    ............ P. 2006-294047

(51) Int. Cl.
*H03L 1/04*    (2006.01)
*H03B 5/36*    (2006.01)

(52) U.S. Cl. ............... 331/176; 331/116 R; 331/177 V; 331/66

(58) Field of Classification Search ............. 331/116 R, 331/116 M, 116 FE, 154, 158, 160, 176, 331/66

See application file for complete search history.

(56) References Cited

U.S. PATENT DOCUMENTS 3,757,245 A * 9/1973 Berger ............ 331/66
4,294,655 A * 10/1981 Pfeffer ............ 162/107
4,833,426 A * 5/1989 Robichon et al. ........ 331/158

FOREIGN PATENT DOCUMENTS

JP    2004-023568    1/2004

OTHER PUBLICATIONS

Rohde et al., RF/Microwave Circuit Design for Wireless Applications, a Wiley-Interscience Publication, pp. 756-762, Apr. 2000.

* cited by examiner

*Primary Examiner*—Robert Pascal
*Assistant Examiner*—Ryan J. Johnson
(74) *Attorney, Agent, or Firm*—Jacobson Holman PLLC (57) ABSTRACT

A crystal oscillator in which a temperature characteristic of an oscillation frequency is improved to omit a measurement operation of the temperature characteristic of the oscillator, and manufacturing is facilitated to reduce a manufacturing time. In the crystal oscillator, a power voltage is applied to a collector of a transistor via series connection of an inductor for resonance and a resistance, a crystal unit is disposed in a loop which returns to an emitter of the transistor from a point between the inductor L4 and the resistance, and further, in the loop, a first parallel circuit in which a stationary capacitor having a negative temperature coefficient and a stationary capacitor having a zero temperature coefficient are connected in parallel with each other is inserted between an oscillation output taking point and the collector.

6 Claims, 7 Drawing Sheets

CRYSTAL OSCILLATOR

BACKGROUND OF THE INVENTION

1. Field of the Invention

The present invention relates to a crystal oscillator having a base ground type oscillation circuit for use at a high frequency of a VHF band or the like. More particularly, it relates to a crystal oscillator in which a temperature characteristic of an oscillation frequency is improved to facilitate manufacturing.

2. Description of the Related Art

Heretofore, Colpitts crystal oscillation circuit is used in a temperature control type crystal oscillator.

This crystal oscillator has an operating temperature in a range of −20 to 70° C., and a temperature of an oven is set around 85° C. in order to assure 70° C.

Moreover, as an inflection point temperature of an SC cut crystal unit, a range of 80 to 90° C. is used.

Furthermore, when the operating temperature is in a range of −20 to 85° C., the temperature of the oven is set around 100° C. in order to assure 85° C.

In addition, as an inflection point temperature of an IT cut crystal unit, a range of 95 to 105° C. is used.

The crystal oscillation circuit mounted on a substrate generally has a negative temperature coefficient, and a temperature characteristic of the crystal unit is synthesized to obtain the temperature characteristic of the crystal oscillator.

The temperature of the oven is set to the inflection point temperature of the temperature characteristic of the crystal oscillator, whereby a frequency change due to a temperature fluctuation can be minimized. The set temperature at this time is slightly lower than the inflection point temperature of a single crystal unit, because the crystal oscillation circuit has the negative temperature coefficient.

Moreover, the temperature characteristic of the crystal oscillator including the crystal oscillation circuit needs to be measured before setting the temperature of the oven, and much time has been required in manufacturing the crystal oscillator.

It is to be noted that the concerned prior art is disclosed in Japanese Patent Application Laid-Open No. 2004-023568 (Patent Document 1).

In Patent Document 1, it is disclosed that in a base ground type oscillation circuit, a stationary capacitor and a thermistor having the negative temperature coefficient are connected in parallel with each other and inserted in a feedback loop of oscillation.

Moreover, a constitution and an operation of the base ground type oscillation circuit are described in A Wiley-Interscience Publication RF/Microwave Circuit Design for Wireless Applications authored by Ulrich L. Rohde, David P. Newkirk, p 756 to p 762.

However, the base ground type crystal oscillation circuit has a temperature coefficient larger than that of Colpitts crystal oscillation circuit, and the inflection point temperature comes close to the operating temperature range in the method of measuring the temperature characteristic of the oscillator to set the temperature of the oven as in the crystal oscillator using the Colpitts crystal oscillation circuit. There has been a problem that the method cannot cope with the circuit.

SUMMARY OF THE INVENTION

The present invention has been developed in view of the above-mentioned situation, and an object thereof is to provide a crystal oscillator in which a temperature characteristic of an oscillation frequency is improved to omit a measurement operation of the temperature characteristic of the oscillator, and manufacturing is facilitated to reduce a manufacturing time.

To solve the above-mentioned problem of the conventional example, according to the present invention, there is provided a crystal oscillator wherein a base ground type crystal oscillation circuit of a transistor is used, a power voltage is applied to a collector of the transistor via series connection of an inductor for resonance and a resistance, an SC or IT cut crystal unit is disposed in a loop which returns to an emitter of the transistor from a point between the inductor for resonance and the resistance, and in the loop, a first parallel circuit is further inserted in which a stationary capacitor having a negative temperature coefficient and a stationary capacitor having a zero temperature coefficient are connected in parallel with each other. In consequence, a satisfactory frequency-temperature characteristic is obtained, temperature compensation is performed, manufacturing steps are facilitated, and a manufacturing time can be reduced.

Moreover, according to the present invention, in the crystal oscillator, the first parallel circuit is inserted between an oscillation output taking point and the collector of the transistor, so that a capacity of the capacitor in the first parallel circuit can be reduced.

Furthermore, according to the present invention, there is provided a crystal oscillator wherein a base ground type crystal oscillation circuit of a transistor is used, a power voltage is applied to a collector of the transistor via series connection of an inductor for resonance and a resistance, an SC or IT cut crystal unit is disposed in a loop which returns to an emitter of the transistor from a point between the inductor for resonance and the resistance, and in the loop, a second parallel circuit is further inserted in which a stationary capacitor having a negative temperature coefficient, a stationary capacitor having a zero temperature coefficient and a trimmer capacitor having a zero temperature coefficient are connected in parallel with one another. In consequence, a satisfactory frequency-temperature characteristic is obtained, temperature compensation is performed, and the trimmer capacitor is regulated, whereby an oscillation frequency can easily be matched, manufacturing steps are facilitated, and a manufacturing time can be reduced.

In addition, according to the present invention, in the crystal oscillator, the second parallel circuit is inserted between an oscillation output taking point and the collector of the transistor, so that a capacity of the capacitor in the second parallel circuit can be reduced.

Moreover, according to the present invention, there is provided a crystal oscillator wherein a base ground type crystal oscillation circuit of a transistor is used, a power voltage is applied to a collector of the transistor via series connection of an inductor for resonance and a resistance, an SC or IT cut crystal unit is disposed in a loop which returns to an emitter of the transistor from a point between the inductor for resonance and the resistance, and in the loop, a third parallel circuit is further inserted in which a stationary capacitor having a negative temperature coefficient, a stationary capacitor having a zero temperature coefficient and a laser trimming capacitor having a zero temperature coefficient are connected in parallel with one another. In consequence, a satisfactory frequency-temperature characteristic is obtained, temperature compensation is performed, and the laser trimming capacitor is trimmed, whereby an oscillation frequency can easily be matched, manufacturing steps are facilitated, and a manufacturing time can be reduced.

Furthermore, according to the present invention, in the crystal oscillator, the third parallel circuit is inserted between an oscillation output taking point and the collector of the transistor, so that a capacity of the capacitor in the third parallel circuit can be reduced.

DESCRIPTION OF REFERENCE NUMERALS

C . . . capacitor, D . . . diode, L . . . inductor, Q . . . transistor, R . . . resistance, X . . . crystal unit

DESCRIPTION OF THE PREFERRED EMBODIMENTS

Embodiments of the present invention will be described with reference to the drawings.

In a first crystal oscillator according to the embodiment of the present invention, a base ground type crystal oscillation circuit is used, and in a loop which returns from a collector to an emitter of a transistor, a first parallel circuit is inserted in which a stationary capacitor having a negative temperature coefficient and a stationary capacitor having a zero temperature coefficient are connected in parallel with each other. In consequence, a satisfactory frequency-temperature characteristic is obtained, temperature compensation is performed with respect to both of a tuning circuit and the oscillation circuit, and further the first parallel circuit is disposed before an output stage, whereby a capacity of the capacitor can be reduced. In consequence, manufacturing steps are facilitated, and a manufacturing time can be reduced.

In a second crystal oscillator according to an embodiment of the present invention, a base ground type crystal oscillation circuit is used, and in a loop which returns from a collector to an emitter of a transistor, a second parallel circuit is inserted in which a stationary capacitor having a negative temperature coefficient, a stationary capacitor having a zero temperature coefficient and a trimmer capacitor having a zero temperature coefficient are connected in parallel with one another. In consequence, in addition to the effect of the first crystal oscillator, there is an effect that the trimmer capacitor is regulated, whereby an oscillation frequency can easily be matched.

In a third crystal oscillator according to the embodiment of the present invention, a base ground type crystal oscillation circuit is used, and in a loop which returns from a collector to an emitter of a transistor, a third parallel circuit is inserted in which a stationary capacitor having a negative temperature coefficient, a stationary capacitor having a zero temperature coefficient and a laser trimming capacitor having a zero temperature coefficient are connected in parallel with one another. In consequence, in addition to the above-mentioned effect of the first crystal oscillator, there is an effect that the laser trimming capacitor is trimmed, whereby an oscillation frequency can easily be matched, and a satisfactory aging characteristic can be obtained.

Figure 1:
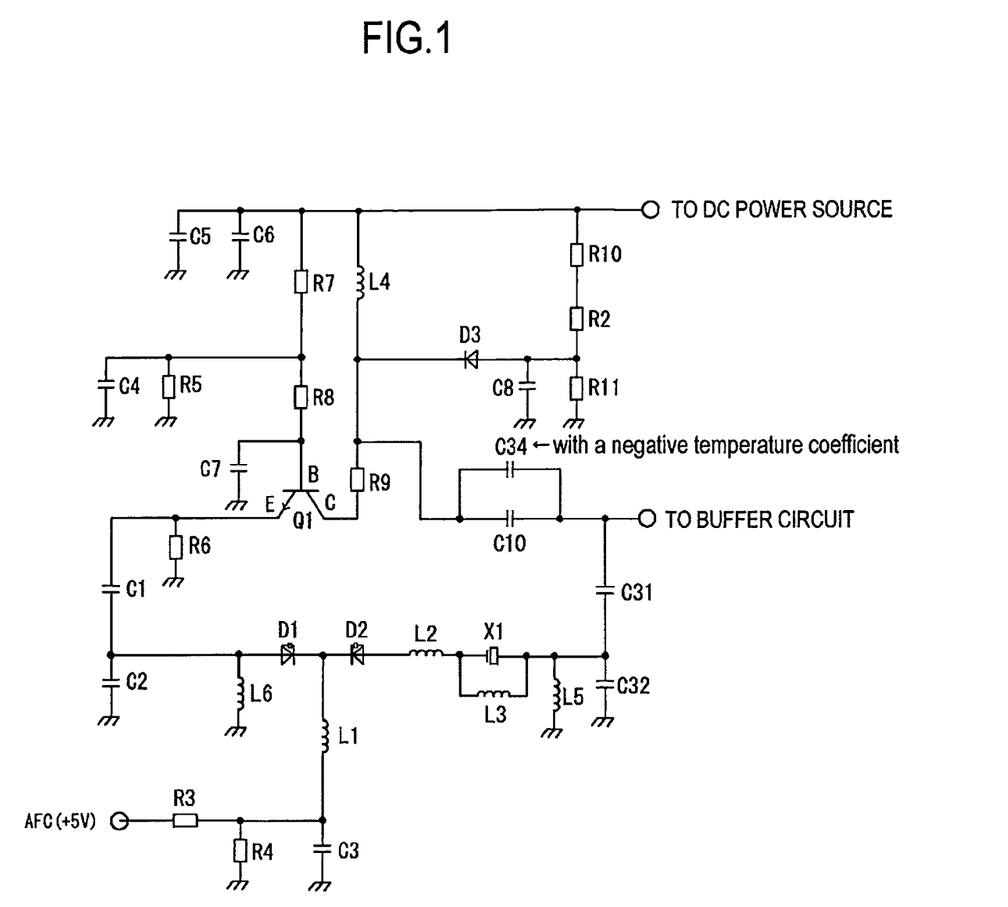
FIG. 1 is a circuit diagram of a first crystal oscillator according to an embodiment of the present invention.

The first crystal oscillator according to the embodiment of the present invention will be described with reference to FIG. 1. FIG. 1 is a circuit diagram of the first crystal oscillator according to the embodiment of the present invention.

In the first crystal oscillator according to the embodiment of the present invention (the first crystal oscillator), as shown in FIG. 1, in a loop which returns from a collector C to an emitter E of a transistor Q1, a circuit (a first parallel circuit) is inserted in which a stationary capacitor C34 having a negative temperature coefficient and a stationary capacitor C10 having a zero temperature coefficient are connected in parallel with each other.

Specifically, in the first crystal oscillator, as shown in FIG. 1, a DC power line to which a power voltage Vcc is to be applied is connected to the collector C of the transistor Q1 via series connection of an inductor (an inductor for resonance on a collector side) L4 and a resistance R9.

Moreover, the DC power line connected to a base B of the transistor Q1 via series connection of resistances R7 and R8, further the DC power line is connected to capacitors C5 and C6 in parallel, and the other ends of the capacitors are grounded.

Furthermore, a capacitor C4 and a resistance R5 are connected in parallel with each other between the resistance R7 and the resistance R8, and the other ends of the capacitors are grounded.

In addition, one end of a capacitor C7 is connected to between the resistance R8 and the base B of the transistor Q1, and the other end of the capacitor is grounded.

Moreover, the DC power line is connected to resistances R10, R2 and R11 in series, and the other end of the resistance R11 is grounded.

Furthermore, a point between the resistance R2 and the resistance R11 is connected to a point between the inductor L4 and the resistance R9 via a diode D3. The diode D3 has an anode on a resistance R2 side and a cathode on an inductor L4 side.

In addition, one end of a capacitor C8 is connected to the diode D3 on the anode side, and the other end thereof is grounded.

A point disposed between the inductor L4 and the resistance R9 and between a point connected to the diode D3 on the cathode side and the resistance R9 is connected to an output terminal (an oscillation output taking point) to a buffer circuit via the first parallel circuit.

As described above, the first parallel circuit is a circuit in which the stationary capacitor C34 having the negative temperature coefficient and the stationary capacitor C10 having the zero temperature coefficient are connected in parallel with each other.

Capacitors C31 and C32 are connected in series with each other between the first parallel circuit and the output terminal, and the other end of the capacitor C32 is grounded.

Moreover, an emitter of the transistor Q1 is connected to one end of a resistance R6, and the other end of the resistance is grounded.

Furthermore, capacitors C1 and C2 are connected in series to the emitter of the transistor Q1, and the other end of the capacitor C2 is grounded.

A point between the capacitor C31 and the capacitor C32 is connected to a point between the capacitor C1 and the capacitor C2 via a circuit in which a crystal unit X1 and an inductor L3 are connected in parallel with each other, an inductor L2 and a varactor (a circuit in which diodes D1 and D2 are disposed so as to face each other and combined).

The varactor is also referred to as a pulling capacity diode or a variable capacitor, a capacitance changes with a reverse bias voltage, and the varactor operates as the variable capacitor.

One end of an inductor L5 is connected between a point between the capacitor C31 and the capacitor C32 and the circuit in which the crystal unit X1 and the inductor L3 are connected in parallel with each other, and the other end of the inductor is grounded.

One end of an inductor L6 is connected to between a point between the capacitor C1 and the capacitor C2 and the anode of the diode D1, and the other end of the inductor is grounded.

An inductor L1 and a capacitor C3 are connected in series to a point between the diode D1 and the diode D2, and the other end of the capacitor C3 is grounded.

A point between the inductor L1 and the capacitor C3 is connected to a terminal of +5 V of automatic frequency control (AFC) via a resistance R3.

Moreover, one terminal of a resistance R4 is connected between a point between the inductor L1 and the capacitor C3 and the inductor L3, and the other terminal of the resistance is grounded.

The above-mentioned first parallel circuit forms a part of a resonance circuit of the transistor Q1 on a collector C side.

Furthermore, the first crystal oscillator is of a temperature control type, the stationary capacitor C34 having the negative temperature coefficient has a temperature coefficient of −750 ppm/° C., and an SC cut crystal unit is used.

When the crystal unit is SC or IT cut, oscillations in modes A, B or C might occur, but the modes A and B need to be suppressed to perform the oscillation in the mode C.

The inductor L4 for resonance on the collector side suppresses the oscillations in the modes A and B, and constitutes the tuning circuit.

The first parallel circuit performs temperature compensation with respect to both of the tuning circuit and the oscillation circuit.

Moreover, the first parallel circuit is inserted between the oscillation output taking point and the collector C of the transistor Q1, whereby the capacity of the capacitor can be reduced. This utilizes a characteristic that a position having a high impedance easily performs the temperature compensation with a small capacity of the capacitor.

It is to be noted that in the first parallel circuit, a capacity ratio between the stationary capacitor C34 having the negative temperature coefficient and the stationary capacitor C10 having the zero temperature coefficient differs with the frequency, but is preferably larger than 1:4 and is about 1:3.

Figure 2:
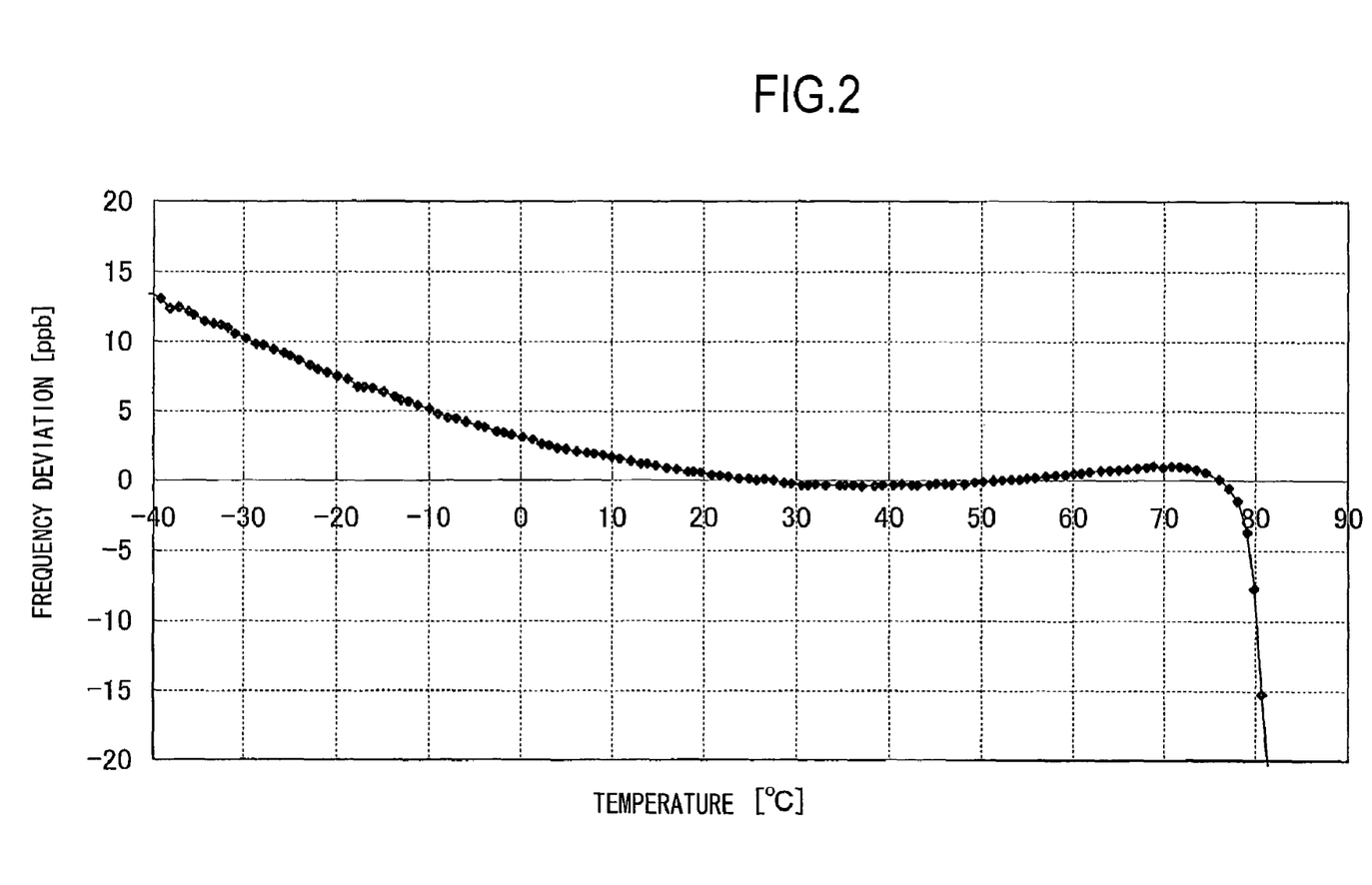
FIG. 2 is a diagram showing a frequency-temperature characteristic (1) in the first crystal oscillator.

The frequency-temperature characteristic of the first crystal oscillator will be described with reference to FIG. 2. FIG. 2 is a diagram showing a frequency-temperature characteristic (1) in the first crystal oscillator.

In an example of FIG. 2, it is assumed that a crystal oscillator (OCXO) of 100 MHz provided with a constant temperature oven is used, the zero temperature coefficient stationary capacitor C10=6 pF, the negative temperature coefficient stationary capacitor C34=2 pF, an oven set temperature: 83° C., and measurement conditions: 1 minute/1° C. (−40° C.→++85° C., initially left to stand at −40° C. for 60 minutes).

In FIG. 2, the ordinate indicates a frequency deviation, the abscissa indicates a temperature, and a comparatively stable frequency-temperature characteristic is indicated.

Figure 3:
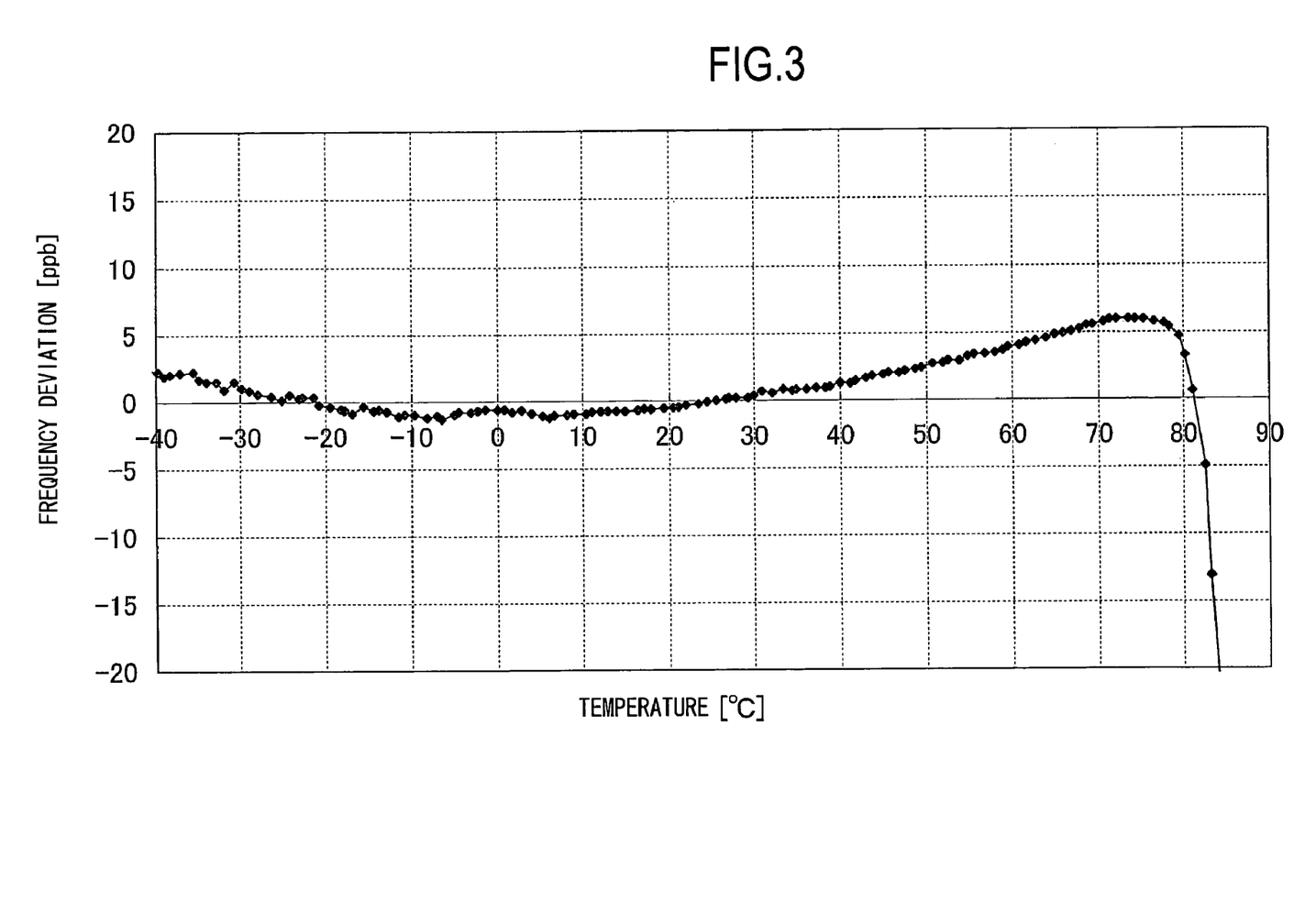
FIG. 3 is a diagram showing a frequency-temperature characteristic (2) in the first crystal oscillator.

Moreover, a frequency-temperature characteristic in the first crystal oscillator will be described with reference to FIG. 3. FIG. 3 is a diagram showing a frequency-temperature characteristic (2) in the first crystal oscillator.

In an example of FIG. 3, it is assumed that an OCXO of 100 MHz is used, the zero temperature coefficient stationary capacitor C10=5 pF, the negative temperature coefficient stationary capacitor C34=3 pF, an oven set temperature: 83° C., and measurement conditions: 1 minute/1° C. (−40° C.→+85° C., initially left to stand at −40° C. for 60 minutes).

FIG. 3 further shows a comparatively stable frequency-temperature characteristic as compared with FIG. 2.

That is, a value of the stationary capacitor C34 having the negative temperature coefficient and a value of the stationary capacitor C10 having the zero temperature coefficient in the first parallel circuit can be regulated to suppress a fluctuation of a frequency deviation with respect to a temperature, and the temperature characteristic of the oscillator in the setting of the temperature of the oven does not have to be measured.

In consequence, there are effects that the manufacturing steps are facilitated and that a manufacturing time can be reduced.

According to the first crystal oscillator, in the loop which returns from the collector C to the emitter E of the transistor Q1, the first parallel circuit is inserted in which the stationary capacitor C34 having the negative temperature coefficient and the stationary capacitor C10 having the zero temperature coefficient are connected in parallel with each other, so that the temperature compensation is performed with respect to both of the tuning circuit and the oscillation circuit. Furthermore, the first parallel circuit is disposed before the output stage, whereby the capacity of the capacitor can be reduced. In consequence, there are the effects that the manufacturing steps are facilitated and that the manufacturing time can be reduced.

Figure 4:
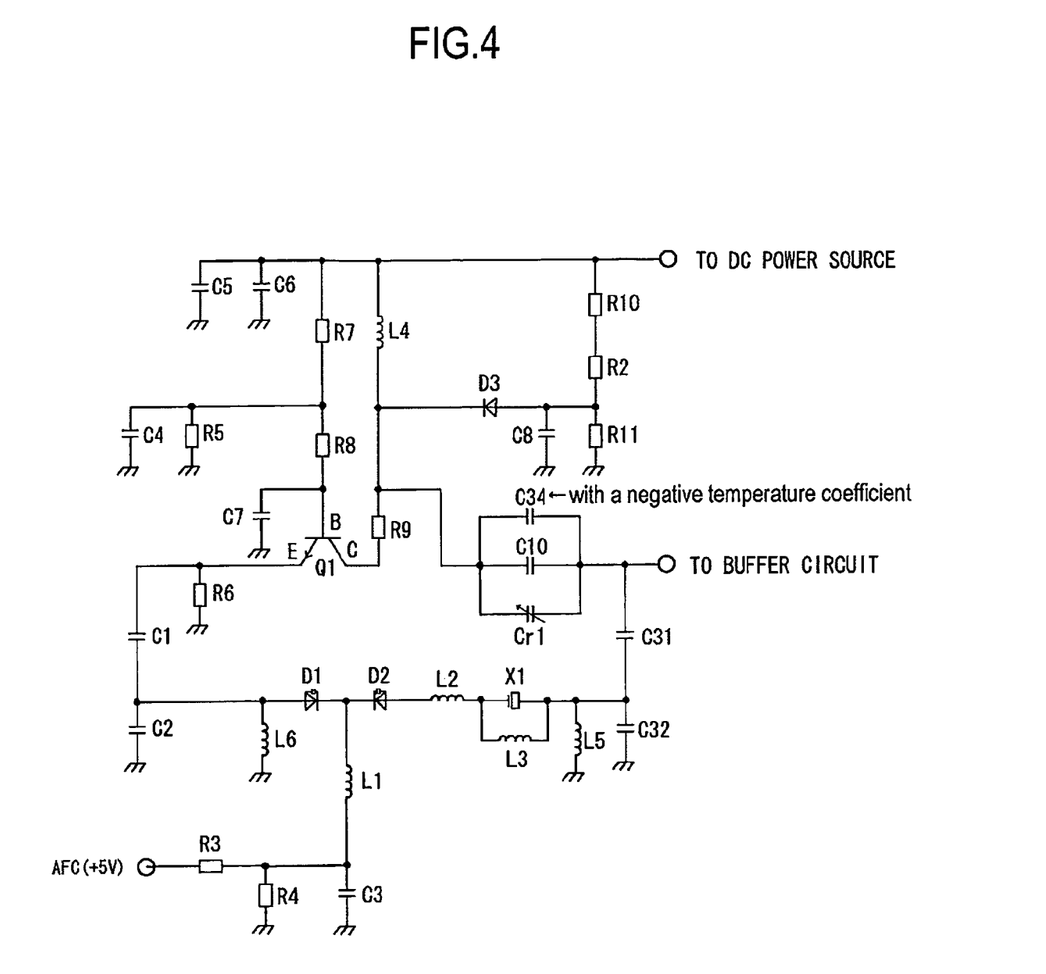
FIG. 4 is a circuit diagram of a second crystal oscillator according to an embodiment of the present invention.

A second crystal oscillator according to an embodiment of the present invention will be described with reference to FIG. 4. FIG. 4 is a circuit diagram of the second crystal oscillator according to the embodiment of the present invention.

As shown in FIG. 4, the second crystal oscillator according to the embodiment of the present invention (the second crystal oscillator) is basically similar to the first crystal oscillator, but is different in that in a loop which returns from a collector C to an emitter E of a transistor Q1, a circuit (a second parallel circuit) is inserted in which a stationary capacitor C34 having a negative temperature coefficient, a stationary capacitor C10 having a zero temperature coefficient and a trimmer capacitor Cr1 having a zero temperature coefficient are connected in parallel with one another.

The second parallel circuit forms a part of a resonance circuit on a collector C side of the transistor Q1.

Moreover, in the same manner as in the first crystal oscillator, the second crystal oscillator is of a temperature control type, the stationary capacitor C34 having the negative temperature coefficient has a temperature coefficient of −750 ppm/° C., and an SC cut crystal unit is used.

The trimmer capacitor Cr1 changes a capacity by rotation of a mechanical knob.

That is, the knob of the trimmer capacitor Cr1 is regulated, whereby the capacity is changed, and an oscillation frequency can easily be matched.

Moreover, the temperature coefficient and a capacity value of the capacitor having the negative temperature coefficient are optimized so as to minimize a temperature characteristic of the oscillation frequency.

As described above, since the regulation can be performed so as to minimize the temperature characteristic of the oscillation frequency, an oven temperature can be fixed at, for example, 83° C., it is not necessary that the temperature characteristic of the oscillator is measured to set the optimum temperature of the oven, and a manufacturing time can be reduced.

Figure 5:
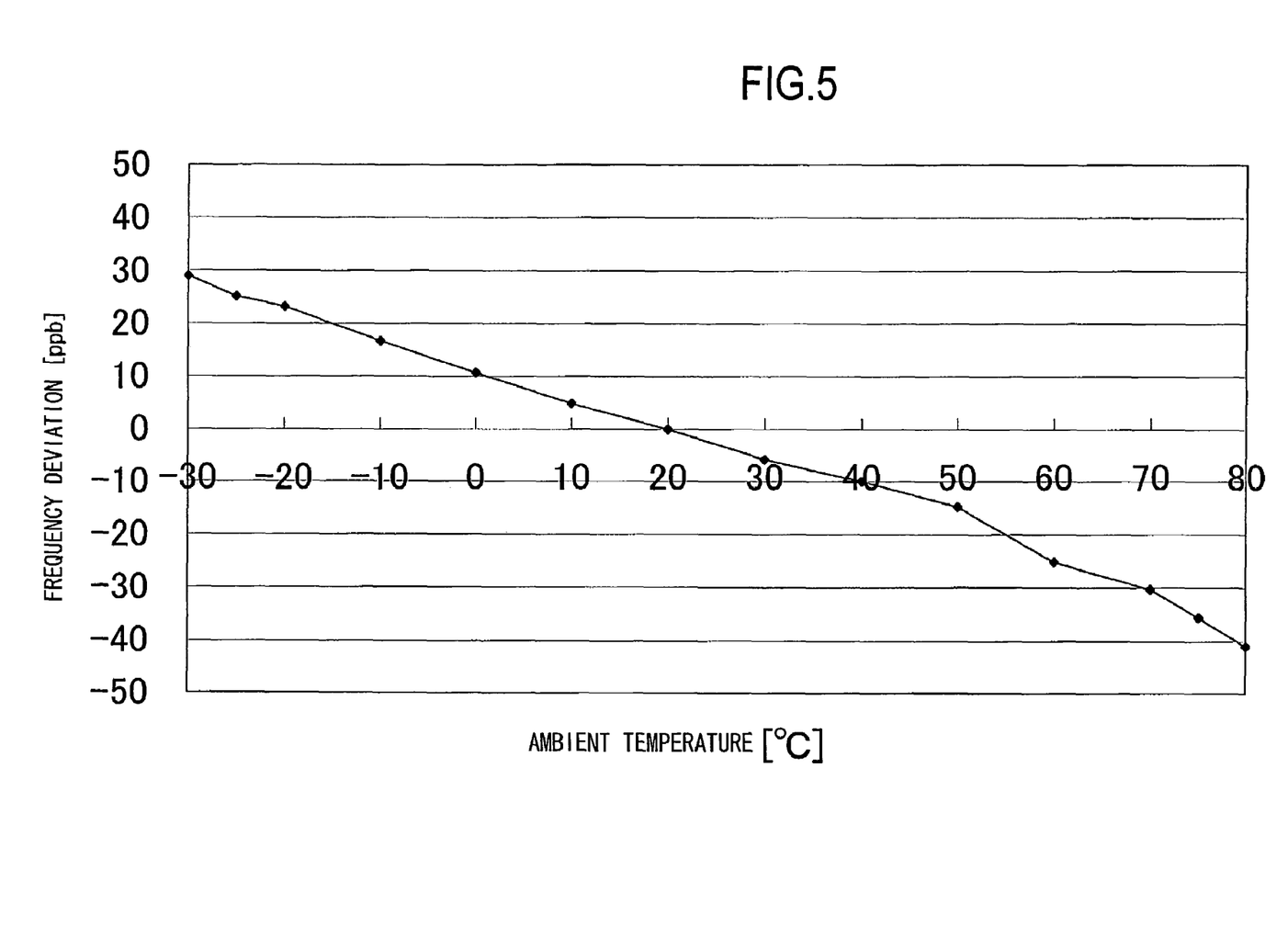
FIG. 5 is a diagram showing a frequency-temperature characteristic before temperature compensation.

Next, to describe a frequency-temperature characteristic of the second crystal oscillator, a frequency-temperature characteristic before temperature compensation will be described with reference to FIG. 5. FIG. 5 is a diagram showing the frequency-temperature characteristic before the temperature compensation.

In an example of FIG. 5, an OCXO of 100 MHz is used, an oven set temperature: 85° C. is set, and a frequency deviation from an ambient temperature increases.

Figure 6:
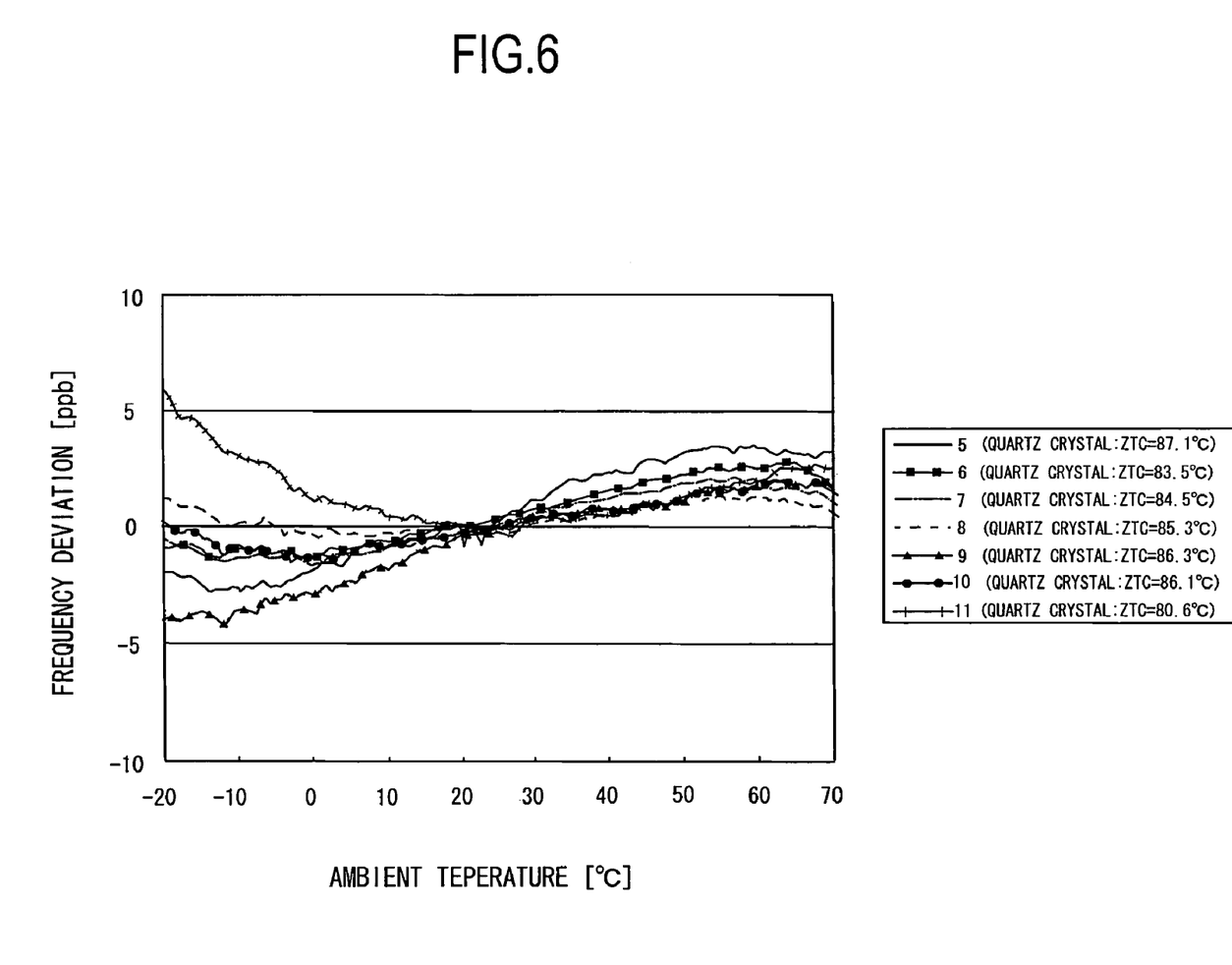
FIG. 6 is a diagram showing a frequency-temperature characteristic in the second crystal oscillator.

Next, the frequency-temperature characteristic of the second crystal oscillator will be described with reference to FIG. 6. FIG. 6 is a diagram showing the frequency-temperature characteristic in the second crystal oscillator.

In an example of FIG. 6, it is assumed that an OCXO of 100 MHz is used, the zero temperature coefficient stationary capacitor C10=5 pF, the negative temperature coefficient stationary capacitor C34=3 pF, the zero temperature coefficient trimmer capacitor Cr1=2 pF, an oven set temperature: 83° C., and measurement conditions: 1 minute/1° C. (−40° C.→+85° C., initially left to stand at −40° C. for 60 minutes).

FIG. 6 shows characteristics of crystal units having different zenith temperatures of the crystal units (ZTC), and indicates a stable frequency-temperature characteristic as compared with FIG. 5.

According to the second crystal oscillator, in the loop which returns from the collector C to the emitter E of the transistor Q1, the second parallel circuit is inserted in which the stationary capacitor C34 having the negative temperature coefficient, the stationary capacitor C10 having the zero temperature coefficient and the trimmer capacitor Cr1 having the zero temperature coefficient are connected in parallel with one another. Therefore, in addition to the effect of the first crystal oscillator, there is an effect that the trimmer capacitor Cr1 is regulated, whereby the oscillation frequency can easily be matched.

Figure 7:
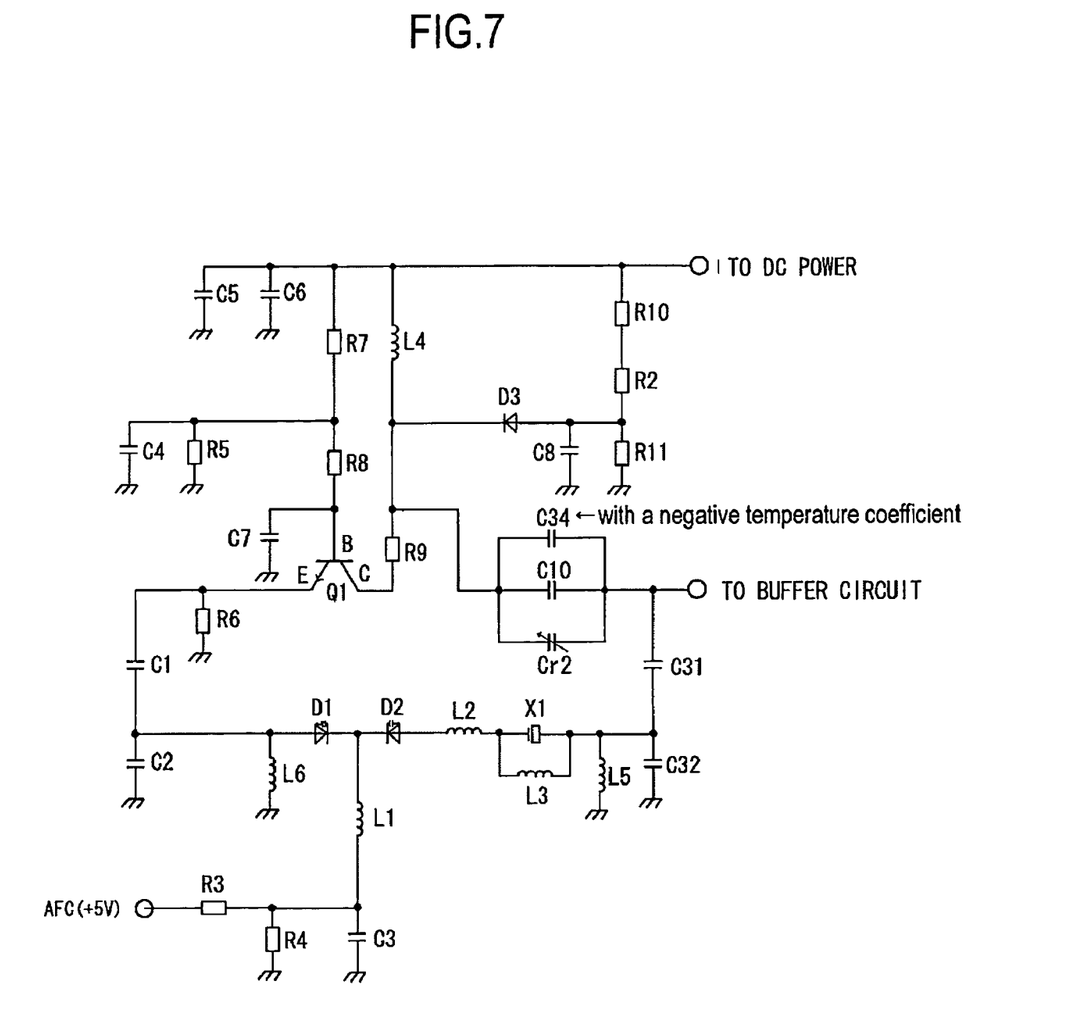
FIG. 7 is a circuit diagram of a third crystal oscillator according to an embodiment of the present invention.

A third crystal oscillator according to an embodiment of the present invention will be described with reference to FIG. 7. FIG. 7 is a circuit diagram of the third crystal oscillator according to the embodiment of the present invention.

As shown in FIG. 7, the third crystal oscillator according to the embodiment of the present invention (the third crystal oscillator) is basically similar to the first and second crystal oscillators, but is different in that in a loop which returns from a collector C to an emitter E of a transistor Q1, a circuit (a third parallel circuit) is inserted in which a stationary capacitor C34 having a negative temperature coefficient, a stationary capacitor C10 having a zero temperature coefficient and a laser trimming capacitor Cr2 having a zero temperature coefficient are connected in parallel with one another.

The above-mentioned third parallel circuit forms a part of a resonance circuit on a collector C side of the transistor Q1.

Moreover, in the same manner as in the first and second crystal oscillators, the third crystal oscillator is of a temperature control type, the stationary capacitor C34 having the negative temperature coefficient has a temperature coefficient of −750 ppm/° C., and an SC cut crystal unit is used.

In the laser trimming capacitor Cr2, an unnecessary portion of the capacitor is removed with laser to set a capacity to a defined value.

That is, the laser trimming capacitor Cr2 is trimmed, whereby the capacity of the capacitor is set to a specific value, and an oscillation frequency can easily be matched.

It is to be noted that since the trimmer capacitor Cr1 of the second parallel circuit in the second crystal oscillator changes the capacity thereof by the rotation of the mechanical knob, there is a problem that an aging characteristic is not satisfactory, but the laser trimming capacitor Cr2 of the third parallel circuit in the third crystal oscillator can obtain a satisfactory aging characteristic.

Moreover, the temperature coefficient and the capacity value of the capacitor having the negative temperature coefficient are optimized so as to minimize the temperature characteristic of the oscillation frequency.

As described above, since the regulation can be performed so as to minimize the temperature characteristic of the oscillation frequency, an oven temperature can be fixed at, for example, 83° C., it is not necessary that the temperature characteristic of the oscillator is measured to set the optimum temperature of the oven, and a manufacturing time can be reduced.

According to the third crystal oscillator, in the loop which returns from the collector C to the emitter E of the transistor Q1, the third parallel circuit is inserted in which the stationary capacitor C34 having the negative temperature coefficient, the stationary capacitor C10 having the zero temperature coefficient and the trimmer capacitor Cr2 having the zero temperature coefficient are connected in parallel with one another. Therefore, in addition to the effect of the first crystal oscillator, there is an effect that the laser trimming capacitor Cr2 is trimmed, whereby the oscillation frequency can easily be matched, and a satisfactory aging characteristic can be obtained.

The present invention is preferable for a crystal oscillator in which when a crystal oscillation circuit of a base ground type is used, a temperature characteristic of an oscillation frequency is reduced, a measurement operation of the temperature characteristic of the oscillator is omitted, and manufacturing is facilitated to reduce a manufacturing time.

What is claimed is:

1. A crystal oscillator wherein a transistor is used,
   a power voltage is applied to a collector of the transistor via series connection of an inductor for resonance and a resistance,
   an SC or IT cut crystal unit is disposed in a loop which returns to an emitter of the transistor from a point between the inductor for resonance and the resistance, and
   in the loop, a parallel circuit is further inserted in which a stationary capacitor having a negative temperature coefficient and a stationary capacitor having a zero temperature coefficient are connected in parallel with each other.

2. The crystal oscillator according to claim 1, wherein the parallel circuit is inserted between an oscillation output taking point and the collector of the transistor.

3. A crystal oscillator wherein a transistor is used,
   a power voltage is applied to a collector of the transistor via series connection of an inductor for resonance and a resistance,
   an SC or IT cut crystal unit is disposed in a loop which returns to an emitter of the transistor from a point between the inductor for resonance and the resistance, and
   in the loop, a parallel circuit is further inserted in which a stationary capacitor having a negative temperature coefficient, a stationary capacitor having a zero temperature coefficient and a trimmer capacitor having a zero temperature coefficient are connected in parallel with one another.

4. The crystal oscillator according to claim 3, wherein the parallel circuit is inserted between an oscillation output taking point and the collector of the transistor.

5. A crystal oscillator wherein a transistor is used, a power voltage is applied to a collector of the transistor via series connection of an inductor for resonance and a resistance, an SC or IT cut crystal unit is disposed in a loop which returns to an emitter of the transistor from a point between the inductor for resonance and the resistance, and in the loop, a parallel circuit is further inserted in which a stationary capacitor having a negative temperature coefficient, a stationary capacitor having a zero temperature coefficient and a laser trimming capacitor having a zero temperature coefficient are connected in parallel with one another.

6. The crystal oscillator according to claim 5, wherein the parallel circuit is inserted between an oscillation output taking point and the collector of the transistor.

* * * * *